United States Patent
Chen et al.

(10) Patent No.: US 8,497,844 B2
(45) Date of Patent: Jul. 30, 2013

(54) CAPACITIVE TOUCH PANEL WITH HIGH TOUCHING SENSITIVITY

(75) Inventors: Lin-Chien Chen, Zhubei (TW); Yen-Lin Huang, Taipei (TW)

(73) Assignee: Orise Technology Co., Ltd., Hsinchu Science Park (TW)

( * ) Notice: Subject to any disclaimer, the term of this patent is extended or adjusted under 35 U.S.C. 154(b) by 506 days.

(21) Appl. No.: 12/926,203

(22) Filed: Nov. 2, 2010

(65) Prior Publication Data

US 2011/0156930 A1    Jun. 30, 2011

(30) Foreign Application Priority Data

Dec. 24, 2009    (TW) ............................... 98144695 A

(51) Int. Cl.
     *G06F 3/041*      (2006.01)

(52) U.S. Cl.
     USPC ............................... 345/173; 341/33; 345/174

(58) Field of Classification Search
     USPC ..................... 341/33; 345/173–174
     See application file for complete search history.

(56) References Cited

U.S. PATENT DOCUMENTS

| | | | |
|---|---|---|---|
| 4,550,221 A | 10/1985 | Mabusth | |
| 7,382,139 B2 * | 6/2008 | Mackey | 324/660 |
| RE40,867 E * | 8/2009 | Binstead | 341/33 |
| 8,305,359 B2 * | 11/2012 | Bolender et al. | 345/174 |
| 2003/0052867 A1 * | 3/2003 | Shigetaka et al. | 345/173 |
| 2007/0085838 A1 * | 4/2007 | Ricks et al. | 345/173 |
| 2008/0018613 A1 * | 1/2008 | Kim et al. | 345/173 |
| 2009/0002337 A1 * | 1/2009 | Chang | 345/174 |
| 2010/0103137 A1 * | 4/2010 | Ciesla et al. | 345/174 |
| 2010/0328248 A1 * | 12/2010 | Mozdzyn | 345/174 |
| 2011/0279398 A1 * | 11/2011 | Philipp | 345/174 |
| 2012/0062510 A1 * | 3/2012 | Mo et al. | 345/174 |
| 2013/0106778 A1 * | 5/2013 | Lin et al. | 345/174 |

* cited by examiner

Primary Examiner — Albert Wong
(74) Attorney, Agent, or Firm — Bacon & Thomas, PLLC

(57) ABSTRACT

A capacitive touch panel has a plurality of first conductor lines and a plurality of second conductor lines. The first conductor lines are disposed in a first direction for sensing a contact with an object. The second conductor lines are disposed in a second direction to be intersected insulatively with the first conductor lines so as to define an overlapping region at each intersection of a first conductor line and a second conductor line. As a driving signal is applied to one of the second conductor lines, the overlapping region defined at the intersection forms a capacitance. Each of the first conductor lines defines at least one opening in each of the overlapping regions.

15 Claims, 9 Drawing Sheets

CAPACITIVE TOUCH PANEL WITH HIGH TOUCHING SENSITIVITY

BACKGROUND OF THE INVENTION

1. Field of the Invention

The present invention relates to the technical field of touch panel and, more particularly, to a capacitive touch panel with high touching sensitivity.

2. Description of Related Art

Most of the current consumer electronic devices are provided with touch pads for use as input devices. In order to meet the light, thin and small features, a touch pad is mostly integrated with a panel as a touch panel for allowing convenient input. According to the sensing principle, the touch pad can be one of resistive type, capacitive type, acoustic wave type or optics type.

The operation principle of touch panels is to sense a voltage, a current, an acoustic wave or an infrared when a finger or other medium touches on a touch screen, so as to detect the coordinates of touching points. For example, a resistive touch panel uses the voltage difference between upper and lower electrodes to determine the location where a force is applied, to thereby detect the touching point. A capacitive touch panel uses the current or the voltage originated from capacitance changes in a static electricity combination of transparent electrodes in row and column with human body to detect the touching coordinate.

FIG. 1 is a schematic diagram of the structure of a prior capacitive touch panel, which is also disclosed in U.S. Pat. No. 4,550,221 granted to Mabusth for a "Touch sensitive control device". The conductive plates 30 are disposed on a substrate 28 in fine metal, with a specific shape (such as diamond shape) formed by etching. As shown in FIG. 1, the conductive plates 30 form a first array in horizontal direction that has conductor lines X1-X12 respectively, and form a second array in vertical direction that has conductor lines Y1-Y12 respectively. Each of the conductor lines X1-X12, Y1-Y12 has a plurality of electrode plates disposed on the substrate in an interleaved and non-overlapped manner. Each diamond-shaped metal plate of conductor lines Y1-Y12 has at least two edges adjacent to the metal plates of conductor lines X1-X12, and at most four edges adjacent thereto. Similarly, each diamond-shaped metal plate of conductor lines X1-X12 has at least two edges adjacent to the metal plates of conductor lines Y1-Y12, and at most four edges adjacent thereto. A detector (not shown) detects the current changes of lateral induced capacitance between the conductor lines Y1-Y12 and X1-X12 when a driver (not shown) generates a driving signal, so as to detect the touching coordinates.

FIG. 2 is a schematic diagram of the structure of another typical capacitive touch panel. The conductive plates are disposed on the upper and lower sides of a substrate in fine metal. As shown in FIG. 2, the conductive plates form a first array at the lower side of the substrate in horizontal direction that has conductor lines X1,X2,X3 . . . , respectively, and form a second array at the upper side in vertical direction that has conductor lines Y1,Y2,Y3 . . . , respectively. Each of the conductor lines X1,X2,X3 . . . , Y1,Y2,Y3 . . . is disposed in an interleaved and non-overlapped manner. A detector 150 detects the current changes of ambient induced capacitance between the electrode plates 120 and 130 when a driver 140 generates a driving signal, to thereby detect the touching coordinates.

FIG. 3 is a schematic diagram of the structure of another prior touch panel, which is also disclosed in US Patent Publication No. 2009/0002337 entitled "Capacitive-type touch panel". The conductive touch panel includes a transparent substrate 3, a plurality of first conductor lines 41 disposed on the substrate 3 in a first direction, and a plurality of second conductor lines 42 disposed on the substrate 3 in a second direction. The plurality of second conductor lines 42 and the plurality of first conductor lines 41 are intersected insulatively. Each of the first conductor lines 41 is intersected with and divided by the second conductor lines 42 into a series of first electrode regions 411. Each of the second conductor lines 42 is intersected with and divided by the first conductor lines 41 into a series of second electrode regions 412. The first and the second conductor lines 41 and 42 form a matrix of capacitance regions when a current is applied to the first conductor lines 41 and the second conductor lines 42. A controller 70 is electrically connected to the first and the second conductor lines 41 and 42 through conductive wires 61 and 62 for detecting the capacitance of the capacitance regions.

FIG. 4 is a schematic diagram of driving the typical capacitive touch panel of FIG. 2. The driver 140 generates a driving signal sequentially on the conductor lines X1-X12. The driving signal passes through the mutual capacitors Cm between the conductor lines X1-X12 and Y1-Y12 to thereby couple charge to the conductor lines Y1-Y12. The detector 150 uses a plurality of sensors 151 to measure charge amount to thereby calculate the capacitance values of the mutual capacitors Cm, where Cm $0$ is set for no contact.

Since the electric lines between the conductor lines X1-X12 and Y1-Y12 may be interfered when a grounded conductor or finger approaches to the touch panel, the capacitance values of the mutual conductors Cm may be influenced. Further, the touching location can be determined by the change proportion (Cm0-Cm1)/Cm0 of the mutual capacitors Cm.

FIGS. 5A and 5B schematically illustrate the changes of the electric lines for the typical capacitive touch panel of FIG. 2. As shown in FIG. 5A, the electric lines are present in the overlapping region (A, A') of the conductor lines X1 and Y1 when the driver 140 generates a driving signal on the conductor line X1, and in this case, Cm=Cm0. As shown in FIG. 5B, the finger can be regarded as a grounded object when a grounded object or finger approaches to the overlapping region of the conductor lines X1 and Y1, and the electric lines that are not shielded by the overlapping region A are influenced by the finger, thus in the case Cm=Cm 1, wherein Cm 1 is smaller than Cm0. Therefore, the change proportion of the mutual capacitors Cm equals to (Cm0-Cm1)/Cm0, and the sensors 151 accordingly determine the touching location. However, since many electric lines are shielded by the overlapping region A, the change proportion (Cm0-Cm1)/Cm0 is not significant. In this case, the sensitivity of the sensors 151 and the detection time should be increased to accumulate enough charge for being detected by the sensors 151.

Therefore, it is desirable to provide an improved capacitive touch panel with high touching sensitivity to mitigate and/or obviate the aforementioned problems.

SUMMARY OF THE INVENTION

The object of the present invention is to provide a capacitive touch panel with high touching sensitivity, which can improve the signal to noise ratio (SNR), shield off noises and provide better equivalent resistance.

To achieve the object, a capacitive touch panel with high touching sensitivity is provided. The capacitive touch panel includes a plurality of first conductor lines and a plurality of second conductor lines. The first conductor lines are disposed in a first direction for sensing the contact with a grounded object. The second conductor lines are disposed in a second direction to be intersected insulatively with the first conductor lines so as to define an overlapping region at each intersection of the first conductor line and the second conductor line. Each overlapping region has a mutual capacitance which equals to a first mutual capacitance when the grounded object does not touch the capacitive touch panel and equals to a second mutual capacitance when the grounded object touches the capacitive touch panel. Each of the first conductor lines defines at least one opening in each of the overlapping regions.

Other objects, advantages, and novel features of the invention will become more apparent from the following detailed description when taken in conjunction with the accompanying drawings.

DETAILED DESCRIPTION OF THE PREFERRED EMBODIMENT

Figure 6:
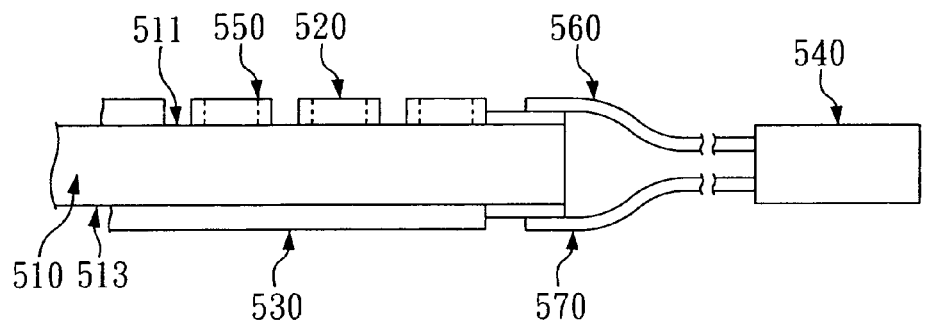
FIG. 6 is a side view of the capacitive touch panel with high touching sensitivity according to an embodiment of the invention.
Figure 7:
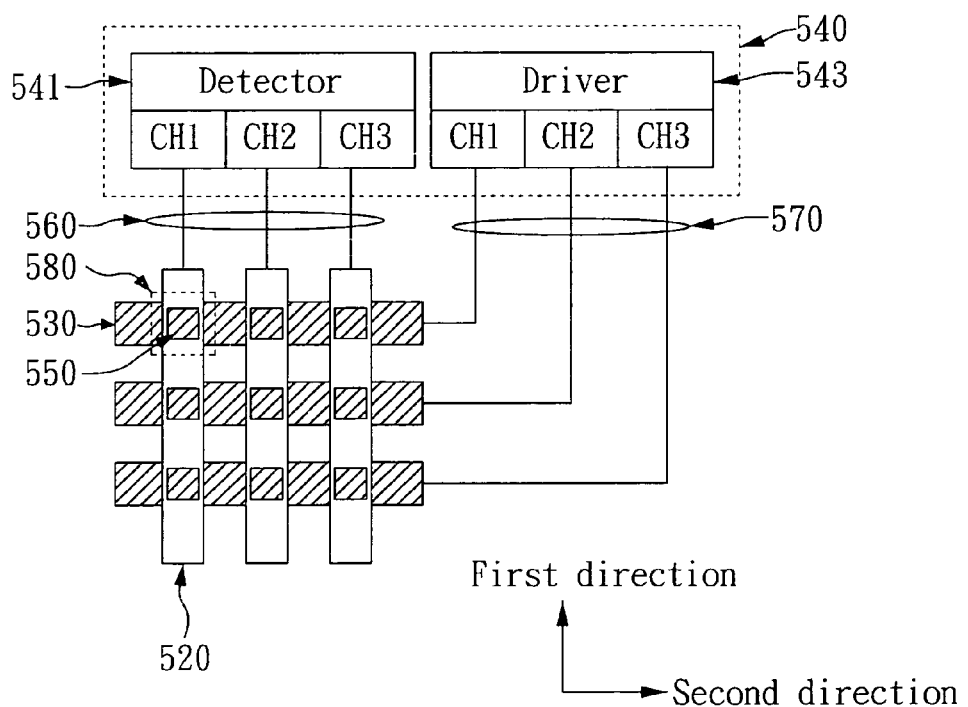
FIG. 7 is a schematic diagram of the capacitive touch panel with high touching sensitivity according to an embodiment of the invention.

FIG. 6 is a side view of the capacitive touch panel with high touching sensitivity according to an embodiment of the invention. FIG. 7 is a schematic diagram of the capacitive touch panel with high touching sensitivity according to an embodiment of the invention. As shown in FIGS. 6 and 7, the capacitive touch panel includes a transparent substrate 510, a plurality of first conductor lines 520, a plurality of second conductor lines 530, and a controller 540.

The transparent substrate 510 has a first surface 511 and a second surface 513 opposite to the first surface 511. The first conductor lines 520 are disposed on the first surface 511, and the second conductor lines 530 are disposed on the second surface 513.

The transparent substrate 510 can be made of glass, polymethylmethacrylate, polypropylene, polyethylene terephthalate, polycarbonate, adhesive, resin, photoresist, silicon dioxide, titanium dioxide, zinc oxide, silicon nitride, aluminum nitride, tantalum oxide, or their combination.

The first conductor lines 520 are disposed in a first direction for sensing the contact of an object. The second conductor lines 530 are disposed in a second direction to be intersected insulatively with the first conductor lines 520 so as to form an overlapping region 580 at each intersection between the first conductor lines 520 and the second conductor lines 530. Each of the overlapping regions 580 at the intersections forms a capacitance. The overlapping regions 580 of the first conductor lines 520 defines at least one opening 550.

The opening 550 can be of a circle shape, rectangle shape, square shape, hexagon shape, octagon shape, polygon shape or their combination.

In this embodiment, the opening 550 is preferably to have a square shape. In this embodiment, the first direction is vertical to the second direction. The capacitance formed at each intersection 580 between the first and the second conductor lines 520 and 530 is a first mutual capacitance, which is negatively proportional to an aperture ratio. The aperture ratio is defined as a ratio of the side length of the opening 550 to the width of the first conductor lines 520.

The controller 540 is connected to the first conductor lines 520 through a set of first wires 560 and the second conductor lines 530 through a set of second wires 570 respectively. The controller 540 is provided for generating the driving signal and detecting each of capacitance value from overlapping region between the second conductor lines 530 and the first conductor lines 520.

The controller 540 includes a detector 541 and a driver 543. The driver 543 is connected to the second conductor lines 530 through the second wires 570 respectively, and periodically generates a driving signal. The detector 541 is connected to the first conductor lines 520 through the first wires 560 respectively, for detecting each of first mutual capacitance value at each overlapping region 580 between the second conductor lines 530 and the first conductor lines 520. Since the second conductor lines 530 are used as driving lines, the traces thereof are made to be wide. Thus, the second conductor lines 530 almost cover the entire lower portion of the transparent substrate 510 to thereby achieve the effect of shielding off noises.

In this embodiment, the first conductor lines 520 define at least one opening 550 at each overlapping region 580 to thereby hollow out the first conductor lines 520.

Figure 8:
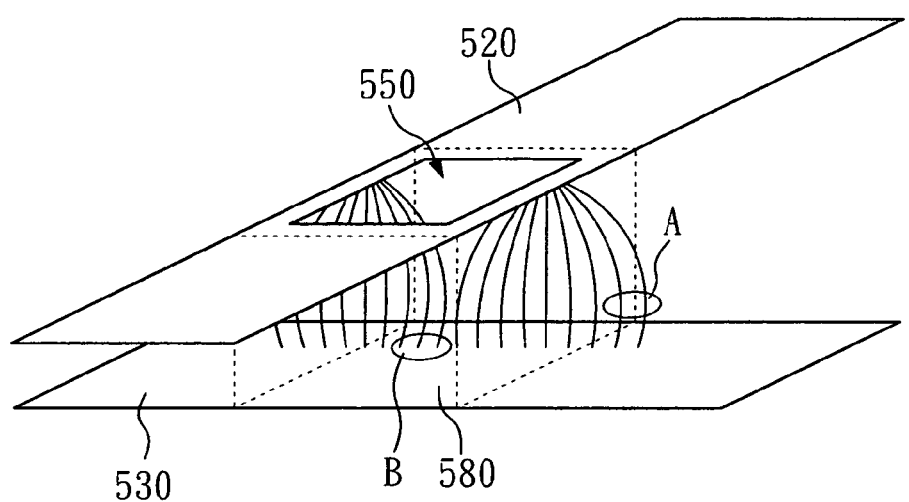
FIGS. 8 and 9 schematically illustrate changes of the electric lines for the capacitive touch panel according to an embodiment of the invention.
Figure 9:
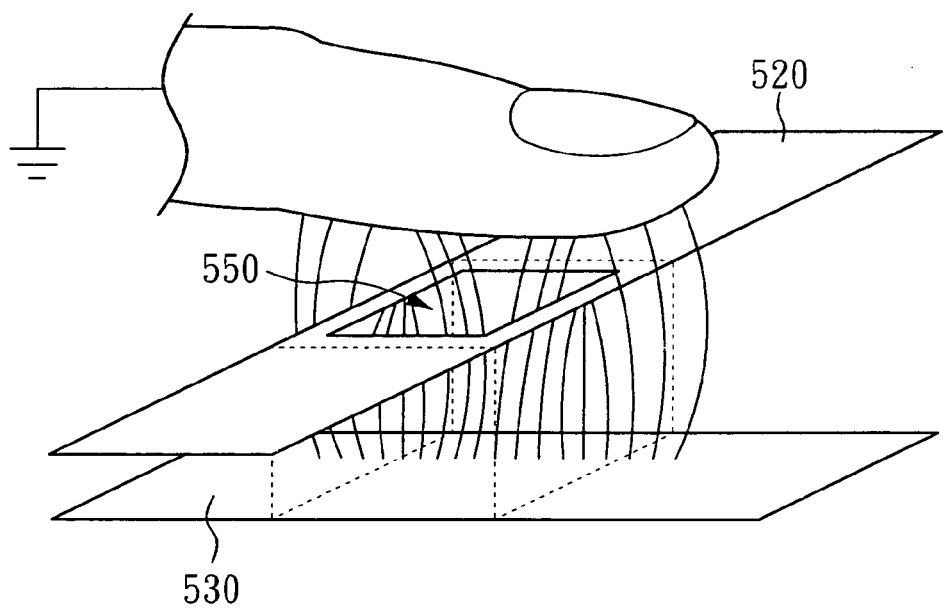

FIGS. 8 and 9 schematically illustrate the changes of the electric lines for the capacitive touch panel according to an embodiment of the invention. As shown in FIG. 8, the electric lines are produced in the overlapping region 580 between the first and the second conductor lines 520 and 530 when the driver 543 generates a driving signal on a second conductor line 530. Since a partial area of the overlapping region at each first conduction line 520 is hollowed out to form the opening 550, the overlapping areas of the first and the second conductor lines 520 and 530 are reduced, so the first mutual capacitance Cm0 is smaller than that in the prior art, and the electric lines that are not covered by the first conductor line 520 increase, as indicated by symbols A and B of FIG. 8.

Figure 5A:
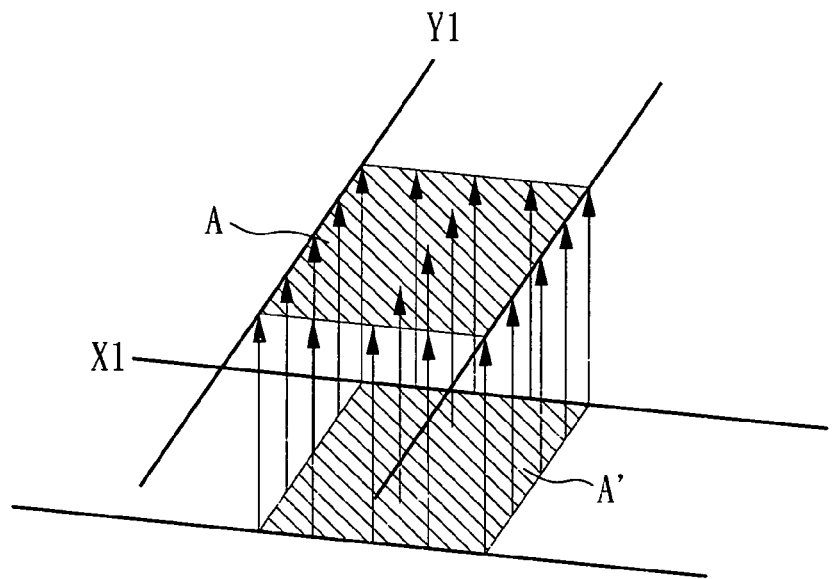
FIGS. 5A and 5B schematically illustrate changes of the electric lines for the typical capacitive touch panel of FIG. 2.
Figure 5B:
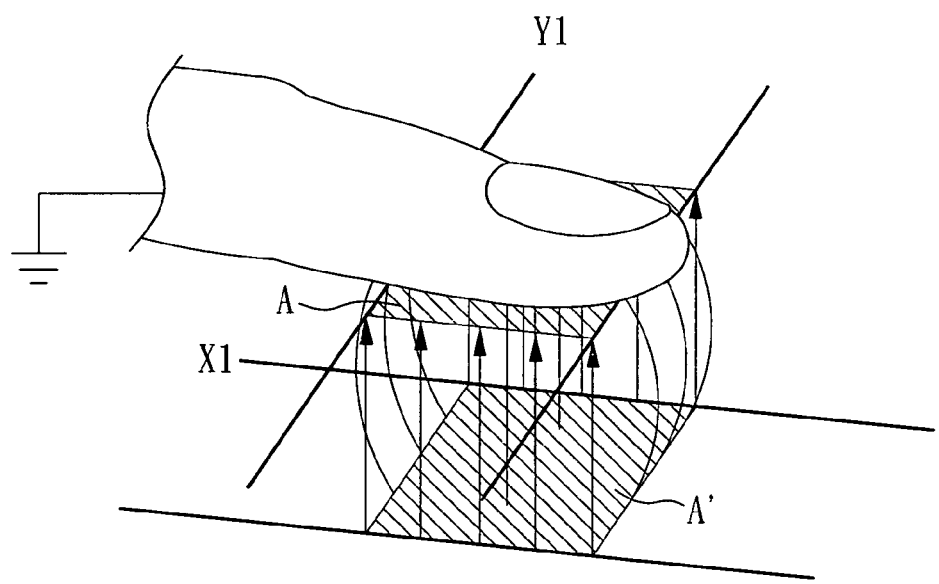

When an object, such as a finger or a grounded conductor, touches the panel, a second mutual capacitance Cm1 is generated at the touched location. The detector 541 determines the coordinate relating to the touched location of the finger or the grounded conductor by detecting the change amount between the first and the second mutual capacitance Cm0 and Cm1. The change amount between the first and the second mutual capacitance Cm0 and Cm1 is positively proportional to an aperture ratio, wherein the aperture ration is defined as the side length of the opening 550 to the width of the first conductor line 520. Since a partial area of the overlapping region at each first conduction line 520 is hollowed out to form the opening 550, the electric lines that are not covered by the first conductor line 520 may easily be interfered by the grounding effect owing to the finger or grounded conductor, as shown in FIG. 9. Thus, the change amount (Cm0-Cm1) of the mutual capacitance is greater than that in FIG. 5. Since the first mutual capacitance is reduced and the change amount (Cm0-Cm1) of the mutual capacitance is increased, the change proportion (Cm0-Cm1)/Cm0 of the mutual capacitance is relatively increased to thereby obtain a higher SNR.

Figure 1:
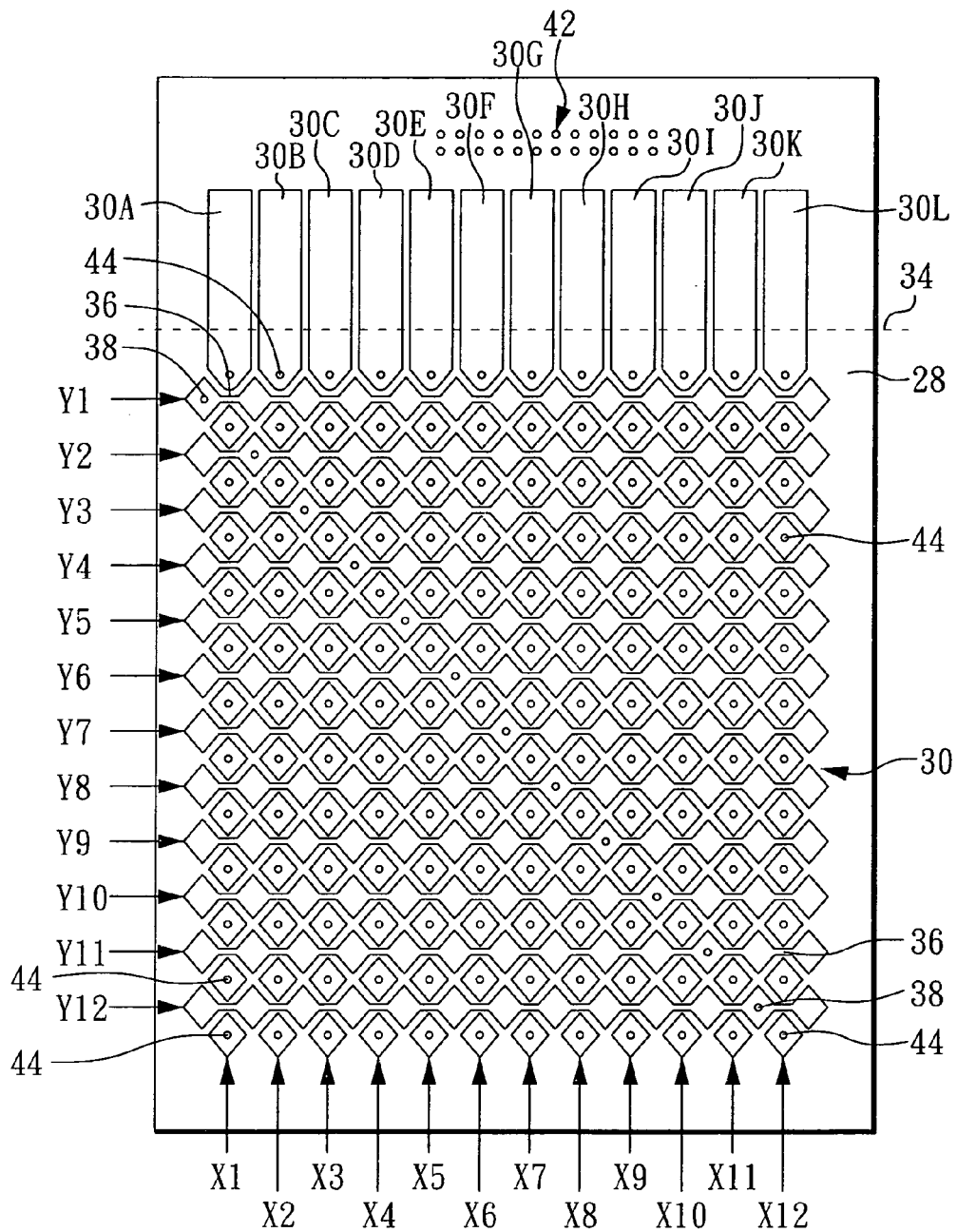
FIG. 1 schematically illustrates the structure of a typical capacitive touch panel.
Figure 2:
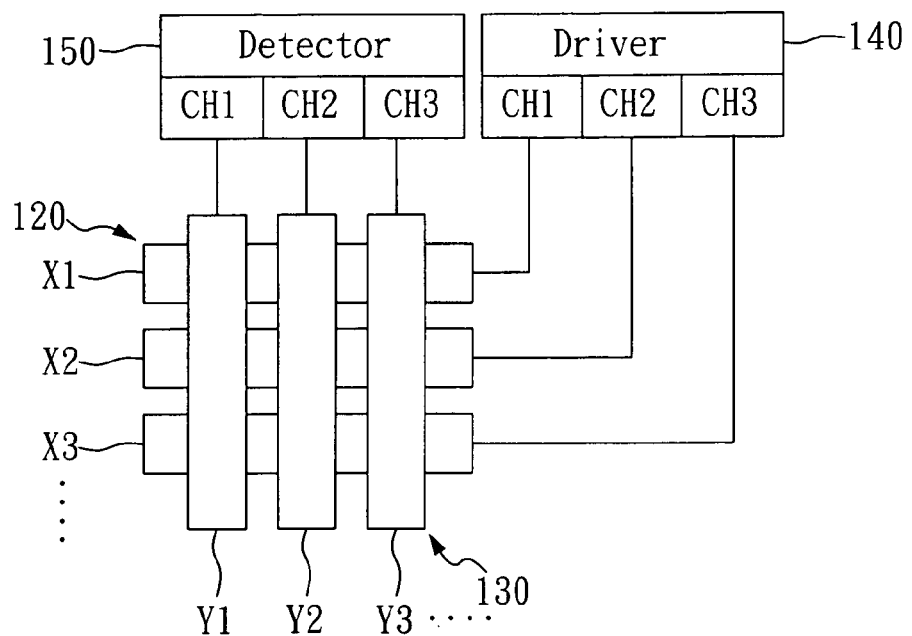
FIG. 2 schematically illustrates the structure of another typical capacitive touch panel.
Figure 3:
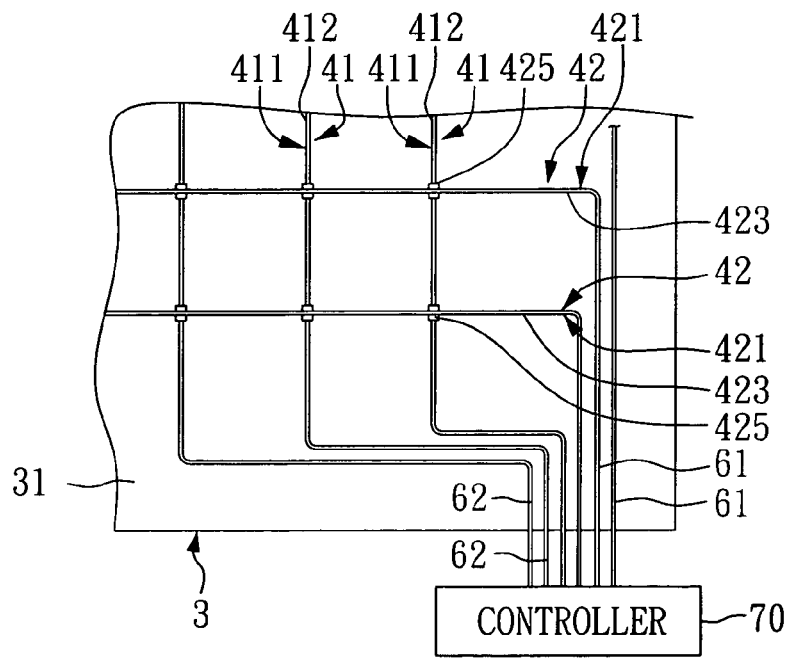
FIG. 3 schematically illustrates the structure of a further typical capacitive touch panel.
Figure 4:
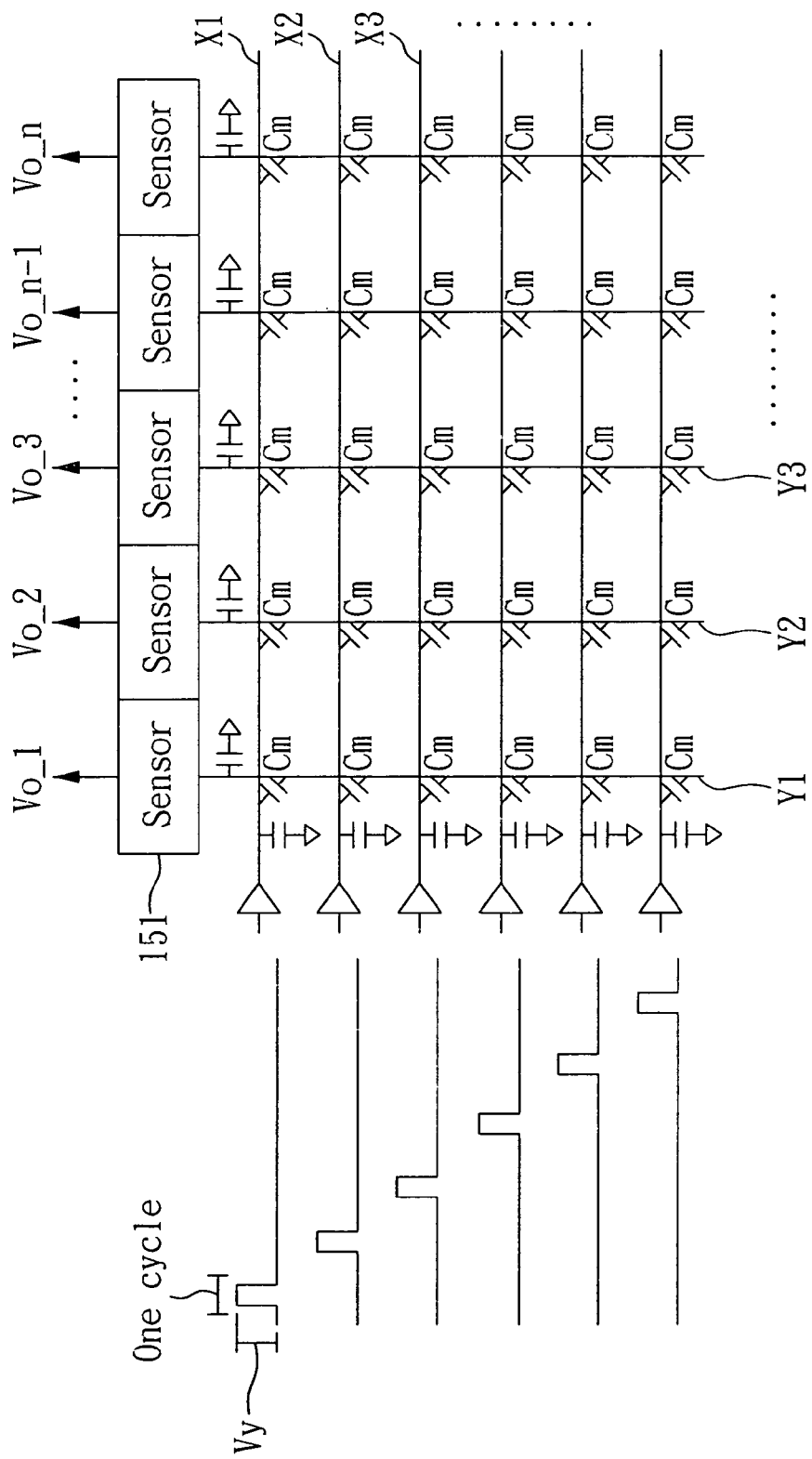
FIG. 4 is a schematic diagram of driving the typical capacitive touch panel of FIG. 2.

The width of the conductive plate of the typical capacitive touch panel in FIG. 1 is unstable, so the resistance is very high. However, the traces of the second conductor lines 530 of the capacitive touch panel in the invention are drawn with the same width, so the equivalent resistance is lower.

Figure 10:
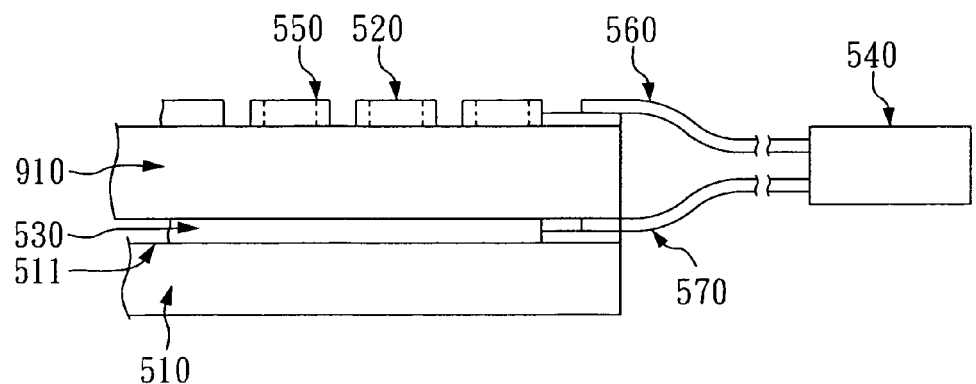
FIG. 10 is a side view of the capacitive touch panel with high touching sensitivity according to another embodiment of the invention.

FIG. 10 is a side view of the capacitive touch panel with high touching sensitivity according to another embodiment of the invention, which is similar to the previous embodiment shown in FIG. 6 except that the transparent substrate 510 in FIG. 10 has a surface 511 disposed thereon the plurality of second conductor lines 530, and the plurality of first conductor lines 520 are disposed over the second conductor lines 530, wherein the first conductor lines 520 are separated from the second conductor lines 530 by an insulating layer 910. The second conductor lines 530 are used to shield off noises.

Figure 11:
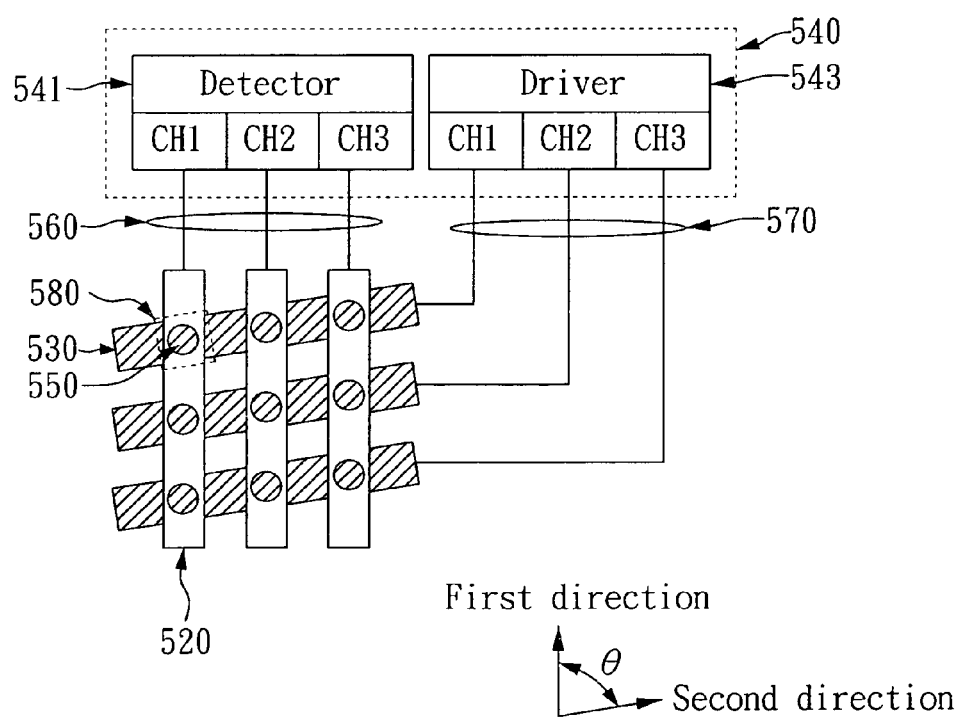
FIG. 11 is a schematic diagram of the capacitive touch panel with high touching sensitivity according to a further embodiment of the invention.

FIG. 11 is a schematic diagram of the capacitive touch panel with high touching sensitivity according to a further embodiment of the invention, which is similar to the first embodiment shown in FIG. 7 except that each first conductor 520 in the first direction and each second conductor line 530 in the second direction form an included angle θ in FIG. 11, wherein 0°≦θ<90° and the opening is a circular shape.

Figure 12:
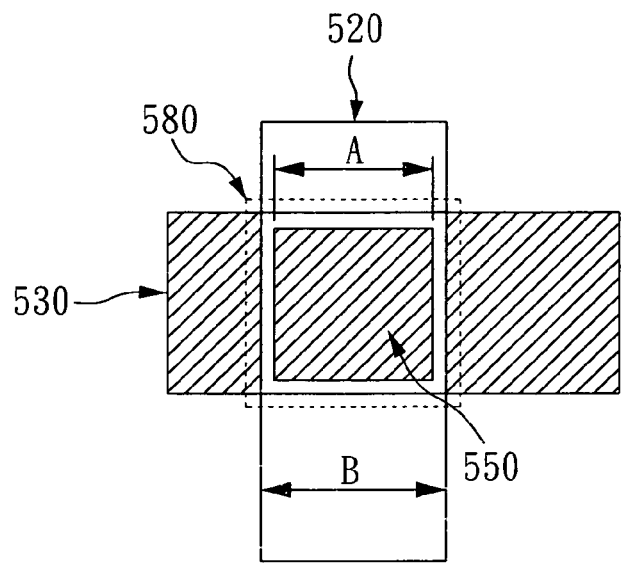
FIG. 12 is an enlarged view of the overlapping region according to the invention.
Figure 13:
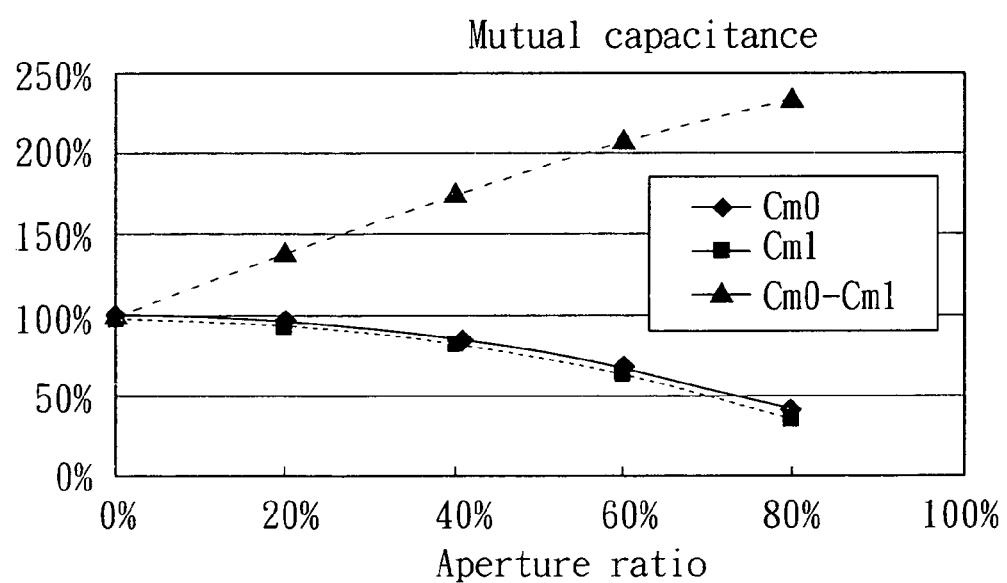
FIG. 13 is a schematic diagram of simulating the mutual capacitance according to the invention.
Figure 14:
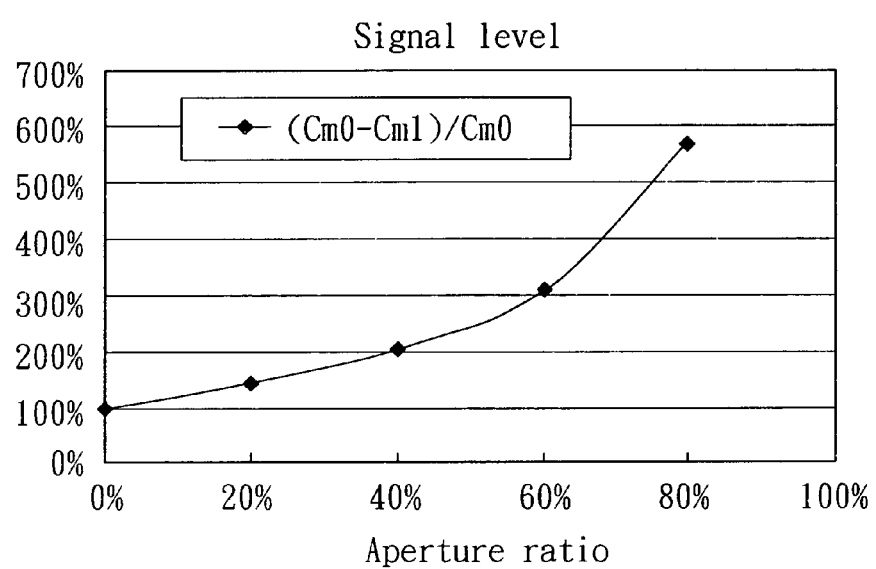
FIG. 14 is a schematic diagram of simulating the signal level according to the invention.

FIG. 12 is an enlarged view of the overlapping region 580 as shown in FIG. 7. In FIG. 12, AB indicates an aperture ratio, i.e., the ratio of the side length A of the opening 550 to the width B of the first conductor line 520. FIG. 13 is a schematic diagram of simulating the mutual capacitance Cm, and FIG. 14 is a schematic diagram of simulating the signal level, wherein a known Laker software is used to perform a layout and a known Star-RC software is used to perform an RC-extraction. In FIG. 13, Cm0 indicates the value of the mutual capacitance Cm without a contact, and Cm1 indicates the value of the mutual capacitance Cm with a contact. It is obvious in FIG. 13 that Cm0 and Cm 1 are reduced with increasing the aperture ratio, and (Cm0-Cm1) is increased with increasing the aperture ratio. As shown in FIG. 14, it is known that the proportion (Cm0-Cm1)/Cm0 corresponding to the signal level is increased with increasing the aperture ratio. Namely, the proportion (Cm0-Cm0)/Cm0 corresponding to the signal level is increased with increasing the side length of the opening 550, and the change of the mutual capacitance becomes more obvious. Thus, the controller 540 can easily detect the capacitance value generated in the overlapping region between the second conductor line 530 and the first conductor line 520.

As cited, the invention hollows out the partial areas of the first conductor lines 520 that are located in the overlapping regions 580 between the first conductor lines 520 and the second conductor lines 530 respectively. Accordingly, the influence on the mutual capacitance owing to finger or grounded conductor is relatively increased, and the change of the mutual capacitance becomes more sensitive, thereby achieving the effect relating to enhancing the signal and improving the SNR. In addition, the second conductor lines 530 almost cover the entire transparent substrate 510 to thereby obtain the effect of shielding off noises. Accordingly, the advantages of the invention can be listed as follows.

1. The SNR is improved.
2. The second conductor lines 530 have a grounding effect to thereby shielding off noises from the lower side of the transparent substrate 510.
3. The traces of the second conductor lines 530 have the same width in layout to thereby have a lower equivalent resistance.

Although the present invention has been explained in relation to its preferred embodiment, it is to be understood that many other possible modifications and variations can be made without departing from the spirit and scope of the invention as hereinafter claimed.

What is claimed is:

1. A capacitive touch panel, comprising:
   a plurality of first conductor lines, disposed in a first direction for sensing contacts with an object; and
   a plurality of second conductor lines disposed in a second direction to be intersected insulatively with the first conductor lines so as to form an overlapping region at each intersection between a first conductor line and a second conductor line, the second conductor lines periodically receiving a driving signal;
   wherein the overlapping region has a mutual capacitance which equals to a first mutual capacitance when the object does not touch the capacitive touch panel and equals to a second mutual capacitance when the object touches the capacitive touch panel, and each of the first conductor lines has at least one opening in each of the overlapping regions.

2. The capacitive touch panel as claimed in claim 1, further comprising a controller which includes:
   a driver, connected to the second conductor lines, for generating the driving signal; and
   a detector, connected to the first conductor lines, for detecting the value of the mutual capacitance, so as to determine a change amount between the first and the second mutual capacitance in order to determine the coordinate of location touched on the capacitive touch panel by the object.

3. The capacitive touch panel as claimed in claim 1, wherein the opening is a square shape.

4. The capacitive touch panel as claimed in claim 1, wherein the opening is a rectangle shape.

5. The capacitive touch panel as claimed in claim 1, wherein the opening is a circular shape.

6. The capacitive touch panel as claimed in claim 1, wherein the opening is a hexagonal shape.

7. The capacitive touch panel as claimed in claim 1, wherein the opening is an octagonal shape.

8. The capacitive touch panel as claimed in claim 1, wherein the opening is a polygonal shape.

9. The capacitive touch panel as claimed in claim 2, wherein the first direction is vertical to the second direction.

10. The capacitive touch panel as claimed in claim 2, wherein the first direction and the second direction form an included angle between zero and 90 degrees.

11. The capacitive touch panel as claimed in claim 3, wherein the first mutual capacitance is negatively proportional to an aperture ratio defined as a ratio of a side length of the opening to a width of the first conductor lines.

12. The capacitive touch panel as claimed in claim 2, further comprising a transparent substrate having a first surface and a second surface, wherein the first surface disposed thereon the first conductor lines, and the second surface opposite to the first surface and disposed thereon the second conductor lines.

13. The capacitive touch panel as claimed in claim 2, further comprising a transparent substrate having a surface disposed thereon the second conductor lines, wherein the first conductor lines are disposed over the second conductor lines, and an insulating layer is provided therebetween.

14. The capacitive touch panel as claimed in claim 13, wherein the second conductor lines form a noise shield for the first conductor lines.

15. The capacitive touch panel as claimed in claim 2, wherein the change amount between the first and the second mutual capacitance is positively proportional to an aperture ratio defined as a ratio of a side length of the opening to a width of the first conductor lines.

* * * * *